US011626359B2

(12) United States Patent
Xie et al.

(10) Patent No.: US 11,626,359 B2
(45) Date of Patent: Apr. 11, 2023

(54) THREE-DIMENSIONAL INTEGRATED CIRCUIT (3D IC) POWER DISTRIBUTION NETWORK (PDN) CAPACITOR INTEGRATION

(71) Applicant: QUALCOMM Incorporated, San Diego, CA (US)

(72) Inventors: Biancun Xie, San Diego, CA (US); Shree Krishna Pandey, San Diego, CA (US); Irfan Khan, San Diego, CA (US); Miguel Miranda Corbalan, San Diego, CA (US); Stanley Seungchul Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 94 days.

(21) Appl. No.: 17/242,083

(22) Filed: Apr. 27, 2021

(65) Prior Publication Data
US 2022/0344249 A1 Oct. 27, 2022

(51) Int. Cl.
*H01L 23/498* (2006.01)
*H01L 21/48* (2006.01)
*H01L 25/065* (2023.01)

(52) U.S. Cl.
CPC .... *H01L 23/49816* (2013.01); *H01L 21/4814* (2013.01); *H01L 25/0657* (2013.01); *H01L 2225/06517* (2013.01)

(58) Field of Classification Search
CPC ........... H01L 23/49816; H01L 25/0657; H01L 2225/06517
See application file for complete search history.

(56) References Cited

U.S. PATENT DOCUMENTS

| 9,548,288 | B1 * | 1/2017 | Ramachandran | ..... H01L 21/768 |
| 11,133,259 | B2 * | 9/2021 | Rubin | ..................... H01L 24/14 |
| 2014/0070422 | A1 | 3/2014 | Hsiao et al. | |
| 2014/0252548 | A1 | 9/2014 | Yen et al. | |
| 2014/0264812 | A1 * | 9/2014 | Chang | ................. H01L 25/0657 257/686 |
| 2016/0300796 | A1 * | 10/2016 | Karhade | ........... H01L 23/49827 |
| 2017/0125383 | A1 * | 5/2017 | Liu | ......................... G11C 8/12 |

(Continued)

FOREIGN PATENT DOCUMENTS

| CN | 114141746 A | * | 3/2022 | ........... H01L 21/565 |
| DE | 102021119280 A1 | * | 3/2022 | ........... H01L 21/486 |

(Continued)

OTHER PUBLICATIONS

International Search Report and Written Opinion—PCT/US2022/021679—ISA/EPO—dated Jun. 30, 2022.

(Continued)

*Primary Examiner* — Mamadou L Diallo
(74) *Attorney, Agent, or Firm* — Qualcomm Incorporated

(57) ABSTRACT

A three-dimensional (3D) integrated circuit (IC) includes a first die. The first die includes a 3D stacked capacitor on a first surface of the first die and coupled to a power distribution network (PDN) of the first die. The 3D IC also includes a second die stacked on the first surface of the first die, proximate the 3D stacked capacitor on the first surface of the first die. The 3D IC further includes active circuitry coupled to the 3D stacked capacitor through the PDN of the first die.

20 Claims, 11 Drawing Sheets

(56) References Cited

U.S. PATENT DOCUMENTS

| | | | |
|---|---|---|---|
| 2017/0185107 A1* | 6/2017 | Kwon | G06F 1/1635 |
| 2017/0366906 A1* | 12/2017 | Lambert | H04R 25/609 |
| 2018/0046908 A1* | 2/2018 | Cox | G06N 3/0635 |
| 2018/0358298 A1* | 12/2018 | Zhai | H01L 23/16 |
| 2019/0041923 A1* | 2/2019 | Atsatt | H03K 19/00369 |
| 2019/0304915 A1* | 10/2019 | Jain | H01L 28/20 |
| 2020/0273801 A1* | 8/2020 | Kim | H01L 23/49811 |
| 2020/0303291 A1* | 9/2020 | Perez-Corona | H01L 23/49816 |
| 2020/0357777 A1* | 11/2020 | Lee | H01L 23/5226 |
| 2020/0402951 A1* | 12/2020 | Chen | H01L 24/27 |
| 2021/0098350 A1* | 4/2021 | Cheah | H01L 23/13 |
| 2021/0193616 A1* | 6/2021 | Cheah | H01L 23/5381 |
| 2021/0242170 A1* | 8/2021 | Dabral | H05K 1/181 |
| 2021/0296283 A1* | 9/2021 | Huang | H01L 23/528 |
| 2021/0335698 A1* | 10/2021 | Cheah | H01L 23/5385 |
| 2021/0343658 A1* | 11/2021 | Talledo | H01L 24/20 |
| 2021/0343684 A1* | 11/2021 | Kim | H01L 24/13 |
| 2021/0384135 A1* | 12/2021 | Kuan | H01L 23/5385 |
| 2022/0028829 A1* | 1/2022 | Cheng | H01L 25/18 |
| 2022/0045004 A1* | 2/2022 | Hwang | H01L 23/49822 |
| 2022/0068821 A1* | 3/2022 | Cheah | H01L 23/5385 |
| 2022/0068833 A1* | 3/2022 | Lim | H01L 23/5385 |
| 2022/0077065 A1 | 3/2022 | Kuan et al. | |
| 2022/0223512 A1* | 7/2022 | Kuo | H01L 23/481 |
| 2022/0230982 A1* | 7/2022 | Palm | H01L 25/50 |

FOREIGN PATENT DOCUMENTS

| | | | | |
|---|---|---|---|---|
| DE | 102021119743 A1 * | 3/2022 | | H01L 21/4853 |
| DE | 102021120029 A1 * | 3/2022 | | H01L 21/4803 |
| DE | 102021120182 A1 * | 3/2022 | | H01L 21/565 |

OTHER PUBLICATIONS

Song E, et al., "Power Integrity Performance Gain of a Novel Integrated Stack Capacitor (ISC) Solution for High-end Computing Applications", 2020 IEEE 70th Electronic Components and Technology Conference (ECTC), IEEE, Jun. 3, 2020, pp. 1358-1362.

Song E., et al., "Through-Silicon-Via-Based Decoupling Capacitor Stacked Chip in 3-D-Ics", IEEE Transactions on Components, Packaging and Manufacturing Technology, IEEE, USA, vol. 3, No. 9, Sep. 1, 2013, pp. 1467-1480.

* cited by examiner

THREE-DIMENSIONAL INTEGRATED CIRCUIT (3D IC) POWER DISTRIBUTION NETWORK (PDN) CAPACITOR INTEGRATION

BACKGROUND

Field

Aspects of the present disclosure relate to integrated circuits (ICs) and, more particularly, to a three-dimensional (3D) power distribution network (PDN) capacitor integration.

Background

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile application devices demand a small form factor, low cost, a tight power budget, and high electrical performance. Mobile package design has evolved to meet these divergent goals for enabling mobile applications that support multimedia enhancements. These mobile applications, however, are susceptible to power and signal routing issues when multiple dies are arranged within the small form factor. In particular, decoupling for a 3D power distribution network (PDN) to suppress power distribution noise is difficult due to a smaller footprint of 3D integrated circuits (ICs).

SUMMARY

A three-dimensional (3D) integrated circuit (IC) includes a first die. The first die includes a 3D stacked capacitor on a first surface of the first die and coupled to a power distribution network (PDN) of the first die. The 3D IC also includes a second die stacked on the first surface of the first die, proximate the 3D stacked capacitor on the first surface of the first die. The 3D IC further includes active circuitry coupled to the 3D stacked capacitor through the PDN of the first die.

A method for fabricating a three-dimensional (3D) integrated circuit (IC) is described. The method includes placing a 3D stacked capacitor on a first surface of a first die. The 3D stacked capacitor is coupled to a power distribution network (PDN) of the first die. The method also includes stacking a second die on the first surface of the first die, proximate the 3D stacked capacitor on the first surface of the first die. The method further includes coupling active circuitry to the 3D stacked capacitor through the PDN of the first die.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
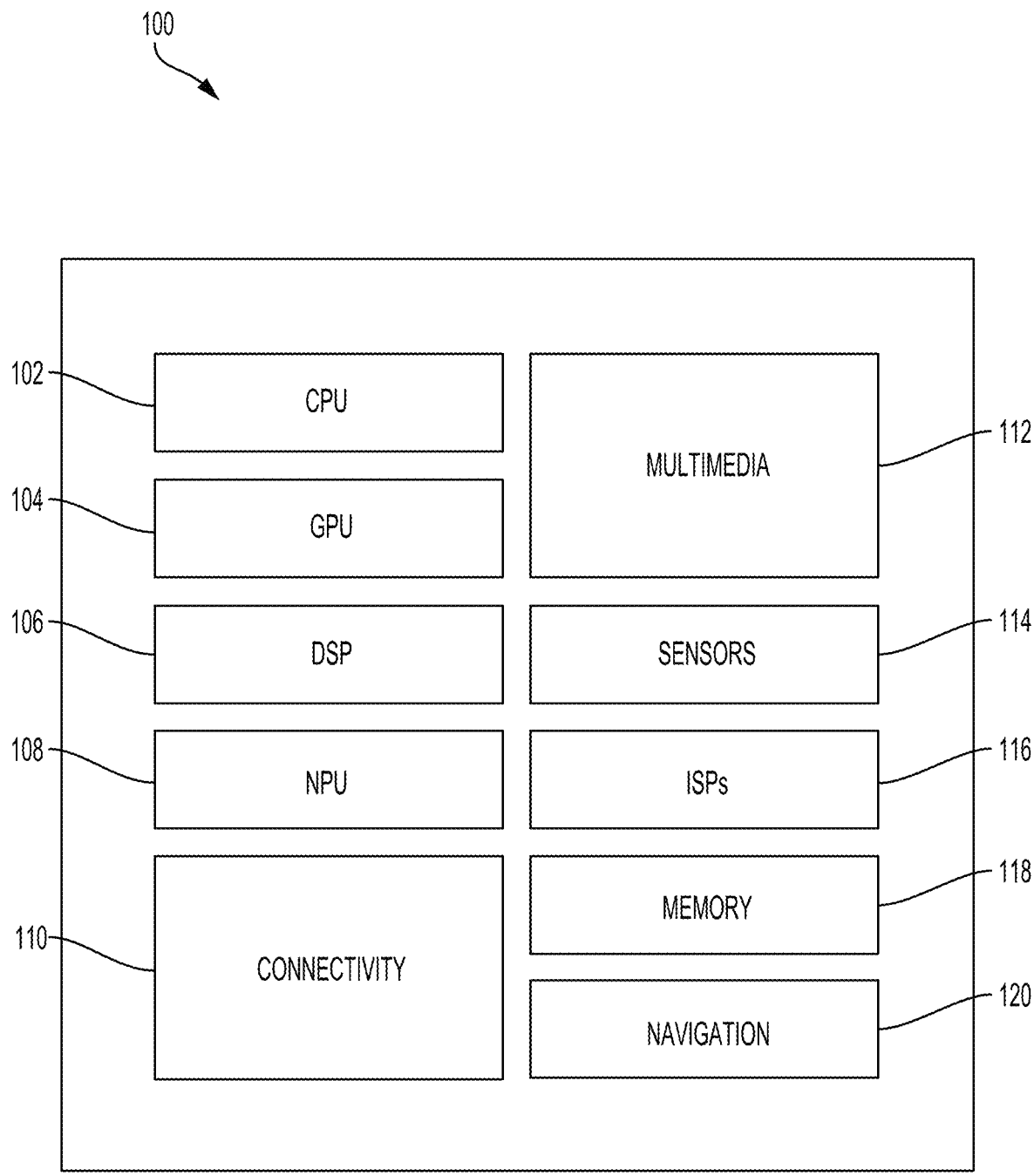
FIG. 1 illustrates an example implementation of a host system-on-a-chip (SOC), including a three-dimensional (3D) power distribution network (PDN) capacitor integration, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

A system hierarchy includes interconnection of active devices at a lowest system level all the way up to system level interconnections at a highest level. In particular, electrical connections exist at each of the levels of the system hierarchy to connect different devices together on an integrated circuit (IC). As integrated circuits become more complex, however, more interconnect layers are used to provide the electrical connections between the devices. More recently, the number of interconnect levels for circuitry has substantially increased due to the large number of devices that are now interconnected in a state-of-the-art mobile application device.

These interconnections include back-end-of-line (BEOL) interconnect layers, which may refer to the conductive interconnect layers for electrically coupling to front-end-of-line (FEOL) active devices of an integrated circuit (IC). The various BEOL interconnect layers are formed at corresponding BEOL interconnect levels, in which lower BEOL interconnect levels use thinner metal layers relative to upper BEOL interconnect levels. The BEOL interconnect layers may electrically couple to middle-of-line (MOL) interconnect layers, which interconnect to the FEOL active devices of an IC.

State-of-the-art mobile application devices demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a development in packaging technology that is useful for mobile applications. This chip first FO-WLP process technology solution provides flexibility to fan-in and fan-out connections from a die to package balls. In addition, this solution also provides a height reduction of a first level interconnect between the die and the package balls of mobile application devices. These mobile applications, however, are susceptible to power and signal routing issues when multiple dies are arranged within the small form factor.

Stacked die schemes and chiplet architectures are becoming mainstream as significant power performance area (PPA) yield enhancements are demonstrated for stacked die and chiplet architecture product lines. Unfortunately, successful stacked die schemes involve high power density targets, which impose significant power distribution losses. Furthermore, a difference in a coefficient of expansion between a die, a substrate, and a printed circuit board (PCB) results in stress on the solder joints attaching a ball grid array (BGA) package to the PCB. The problem is exacerbated by shrinking of ball pitch, increasing of die size, and/or thinning of substrates to accommodate the small form factor.

Various aspects of the present disclosure provide a three-dimensional (3D) power distribution network (PDN) capacitor integration. The process flow for fabrication of the 3D power distribution network (PDN) capacitor integration may include a wafer level packaging (WLP) process technology. It will be understood that the term "layer" includes film, and is not construed as indicating a vertical or horizontal thickness unless otherwise stated. As described, the term "substrate" may refer to a substrate of a diced wafer or may refer to a substrate of a wafer that is not diced. As further described, the term "laminate" may refer to a multilayer sheet to enable packaging of an IC device. As described, the term "chiplet" may refer to an integrated circuit block, a functional circuit block, or other like circuit block specifically designed to work with other similar chiplets to form a larger, more complex chiplet architecture. The terms "substrate," "wafer," and "laminate" may be used interchangeably. Similarly, the terms "chip," "chiplet," and "die" may be used interchangeably.

A 3D integrated circuit (IC) relies on an architecture of stacked dies that provides a technology for achieving higher performance, increased functionality, lower power consumption, and smaller footprint. Unfortunately, capacitive decoupling for a 3D power distribution network (PDN) to suppress power distribution noise is challenging. In particular, the available space for landside capacitors (LSCs) under a die shadow in a 3D IC power distribution network is limited due to the smaller footprint of 3D ICs. For example, different logic blocks of a 3D IC may be placed to overlap each other in the stacked dies, making it even more challenging to provide decoupling for the circuitry in the stacked dies. In addition, an electrical path of the traditional landside capacitor placement on a package substrate may exhibit larger inductance parasitics, which may degrade the landside capacitor decoupling performance.

Aspects of the present disclosure are directed to a 3D power distribution network (PDN) capacitor integration. In some aspects of the present disclosure, a capacitor integration approach uses dead space in a 3D power distribution network by directly coupling a capacitor to one of the stacked dies of a 3D IC. As described, the integrated capacitor is referred to as a 3D stacked capacitor. In some aspects of the present disclosure, the 3D stacked capacitor may be a deep trench capacitor integrated in a semiconductor (e.g., silicon) die. The 3D stacked capacitor may be an integrated passive device (IPD) capacitor.

According to aspects of the present disclosure, a 3D integrated circuit (3D IC) includes a first die having a 3D stacked capacitor on a first surface of the first die. In this configuration, the 3D stacked capacitor is coupled to a power distribution network (PDN) of the first die. The 3D IC also includes a second die stacked on the first side of the first die. The second die is stacked on the first die proximate to the 3D stacked capacitor on the first surface of the first die.

The 3D IC further includes active circuitry coupled to the 3D stacked capacitor through the PDN of the first die.

FIG. 1 illustrates an example implementation of a host system-on-a-chip (SOC) 100, which includes a 3D power distribution network (PDN) capacitor integration, in accordance with aspects of the present disclosure. The host SOC 100 includes processing blocks tailored to specific functions, such as a connectivity block 100. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SOC 100 includes various processing units that support multi-threaded operation. For the configuration shown in FIG. 1, the host SOC 100 includes a multi-core central processing unit (CPU) 102, a graphics processor unit (GPU) 104, a digital signal processor (DSP) 106, and a neural processor unit (NPU) 108. The host SOC 100 may also include a sensor processor 114, image signal processors (ISPs) 116, a navigation module 120, which may include a global positioning system (GPS), and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
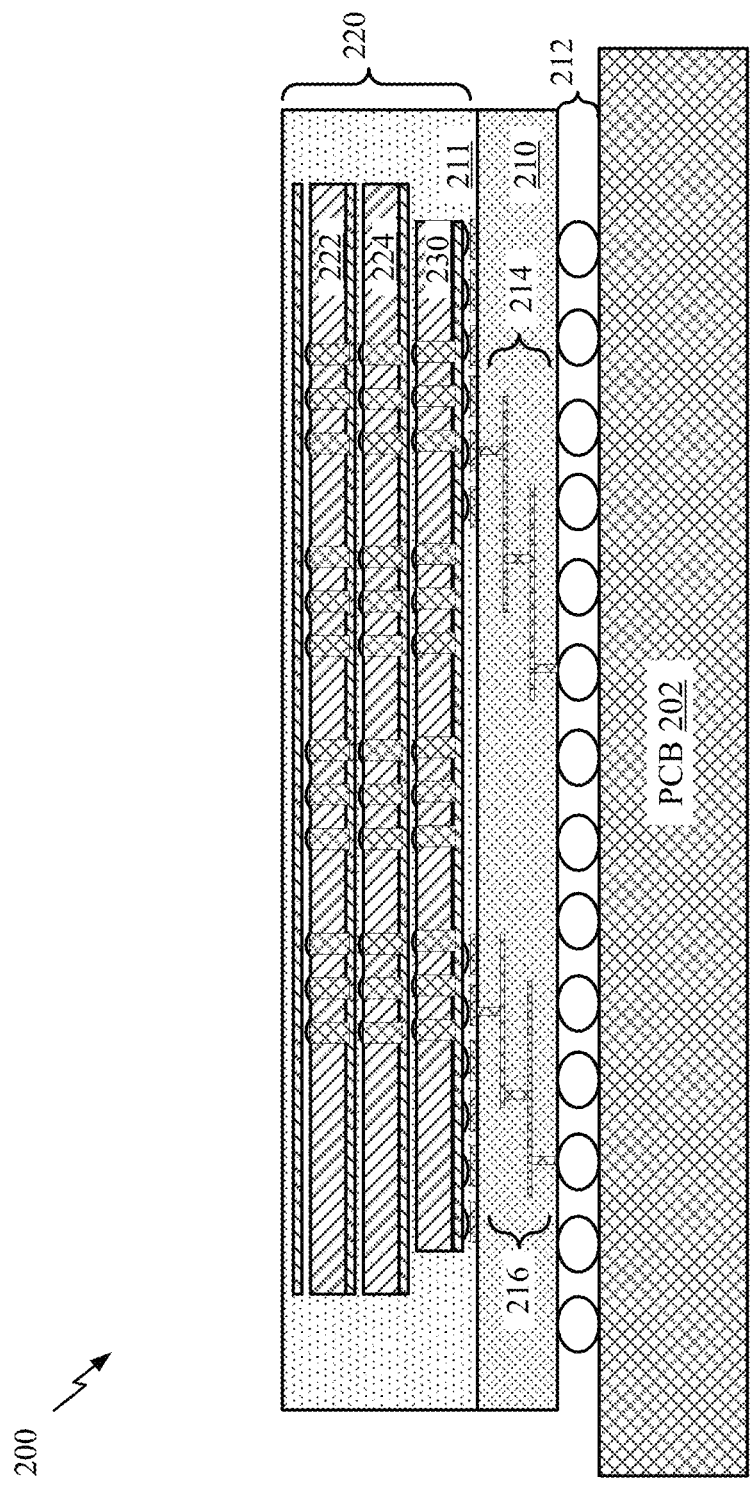
FIG. 2 shows a cross-sectional view of a stacked integrated circuit (IC) package, including the host system-on-a-chip (SOC) of FIG. 1.

FIG. 2 shows a cross-sectional view illustrating a stacked integrated circuit (IC) package 200 of the host system-on-a-chip (SOC) 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a 3D chip stack 220, including stacked dies 222, 224, and 230, encapsulated by mold compound 211. In one aspect of the present disclosure, the die 230 is the host SOC 100 of FIG. 1.

Figure 3:
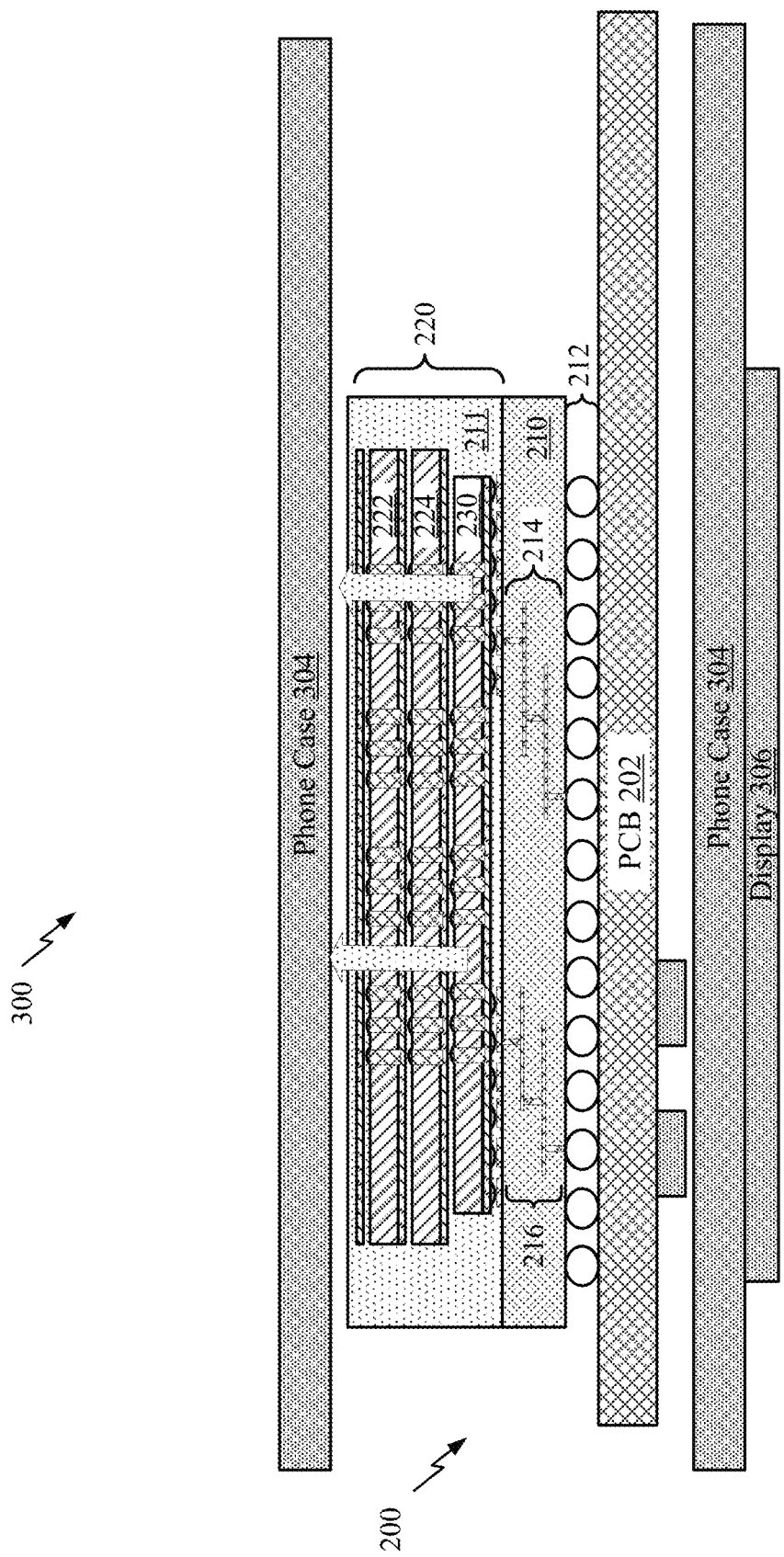
FIG. 3 shows a cross-sectional view illustrating the stacked integrated circuit (IC) package of FIG. 2, incorporated into a mobile device, according to one aspect of the present disclosure.

FIG. 3 shows a cross-sectional view illustrating the stacked integrated circuit (IC) package 200 of FIG. 2, incorporated into a wireless device 300, according to one aspect of the present disclosure. As described, the wireless device 300 may include, but is not limited to, a smartphone, tablet, handheld device, or other limited form factor device configured for 5G communications. Representatively, the stacked IC package 200 is within a phone case 304, including a display 306. In this configuration, a 3D stacked capacitor is integrated into the stacked IC package 200, for example, as shown in FIGS. 4A to 7.

Figure 4A:
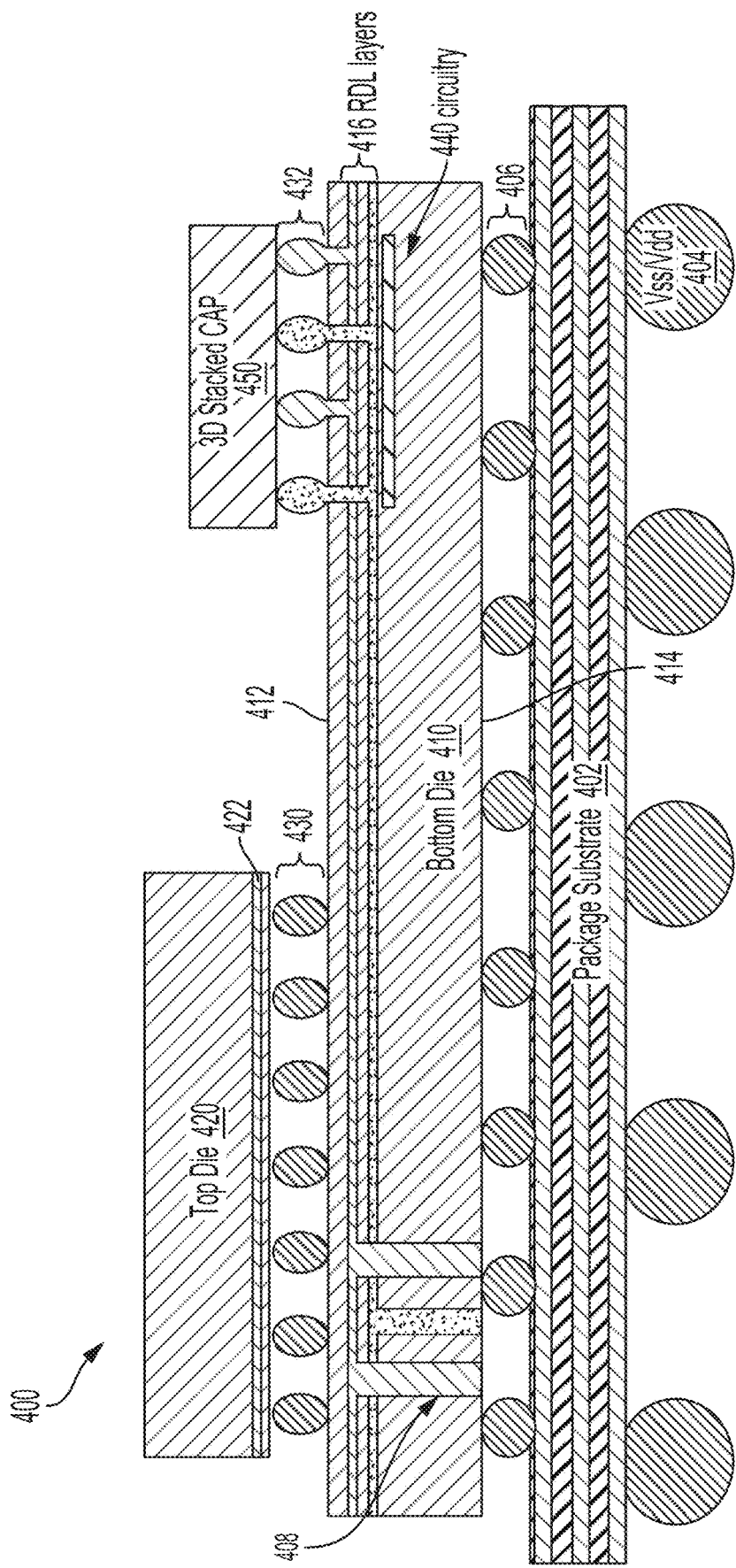
FIGS. 4A and 4B are block diagrams illustrating cross-sectional views of a three-dimensional (3D) integrated circuit (IC) stacked power distribution network (PDN) having a 3D stacked capacitor integrated on die, according to aspects of the present disclosure.
Figure 4B:
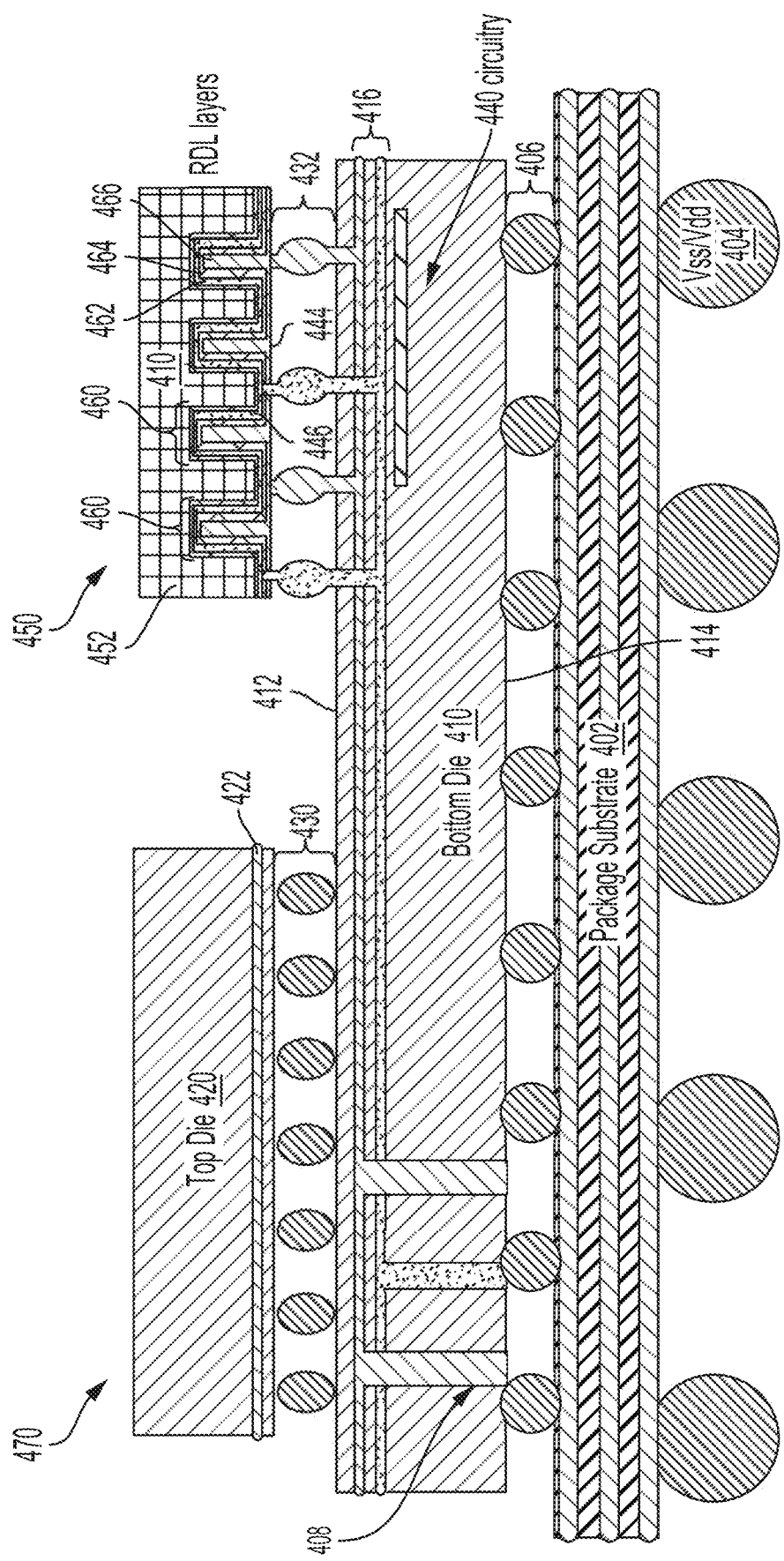

FIGS. 4A and 4B are block diagrams illustrating cross-sectional views of a 3D integrated circuit (IC) stacked power distribution network (PDN) having a 3D stacked capacitor integrated on die, according to aspects of the present disclosure. As shown in FIG. 4A, a 3D IC 400 includes a first die 410 (e.g., a bottom die) and a second die 420 (e.g., a top die) stacked on the first die 410. In this configuration, first micro-bumps 430 directly contact a power rail 422 of the second die 420 to redistribution layers (RDLs) 416 (e.g., a power rail and a ground rail) of the first die 410. As described, the redistribution layers 416 of the first die 410 are collectively referred to as a power distribution network of the first die 410 and/or a 3D IC PDN architecture of the 3D IC 400.

In the 3D IC PDN architecture of the 3D IC 400, a width of a second die 420 is less than a width of the first die 410. The width difference between the first die 410 and the second die 420 provides free available space along a first surface 412 of the first die 410 (e.g., above the bottom die), opposite a second surface 414 of the first die 410. This aspect of the present disclosure uses the free available space along the first surface 412 of the first die 410 to place a 3D stacked capacitor 450 on the first surface 412 of the first die 410. In this configuration, second micro-bumps 432 directly contact the redistribution layers 416 of the first die 410 to the 3D stacked capacitor 450, which is further illustrated in FIG. 4B.

In this aspect of the present disclosure, the 3D stacked capacitor 450 is placed proximate active circuitry 440 (e.g., a logic circuit). That is, the 3D stacked capacitor 450 is placed in close proximity to the active circuitry (e.g., directly above the IP circuitry). In addition, the 3D stacked capacitor 450 is contacted to the active circuitry 440 using the second micro-bumps 432 and the redistribution layers 416. As a result, this aspect of the present disclosure provides more effective capacitive decoupling for the active circuitry 440 relative to both a landside capacitor placement and a die side capacitor (DSC) placement. Traditionally, landside capacitors are placed among power (e.g., Vss/Vdd) balls 404 coupled to the package substrate 402, which is coupled to the first die 410 through package bumps 406. Placing the 3D stacked capacitor 450 on the first surface 412 of the first die 410 potentially saves landside capacitor space under a die shadow on the package substrate 402. In this configuration, the redistribution layers 416 may be coupled to the package bumps through vias 408.

FIG. 4B illustrates a 3D IC 470 integrating the 3D stacked capacitor 450 on die, according to aspects of the present disclosure. The 3D IC 470 is similar to the 3D IC 400 shown in FIG. 4A and is shown using similar reference numbers. In this configuration, the 3D IC 470 also includes the first die 410 having the 3D stacked capacitor 450 on a first surface 412 of the first die 410. The 3D stacked capacitor 450 is also coupled to a power distribution network (e.g., the redistribution layers 416) of the first die 410. The 3D IC 470 also includes the second die 420 stacked on the first surface 412 of the first die 410. The second die 420 is stacked on the first die 410 proximate to the 3D stacked capacitor 450 on the first surface 412 of the first die 410. The 3D IC 470 also includes the active circuitry 440 coupled to the 3D stacked capacitor 450 through the PDN of the first die 410 (e.g., using the second micro-bumps 432 and the redistribution layers 416).

In some aspects of the present disclosure, the 3D stacked capacitor 450 is configured as an integrated passive device (IPD) capacitor die. In this configuration, the 3D stacked capacitor 450 includes a semiconductor substrate 452 (e.g., a silicon substrate) having trench capacitors 460. In this example, the trench capacitors 460 include a first layer 462 (e.g., a polysilicon layer), a second layer 464 (e.g., a dielectric layer) on the first layer 462, and a third layer 466 (e.g., a polysilicon layer) on the second layer 464. In addition, the 3D stacked capacitor 450 is configured with a power rail 444 (e.g., Vcc) and a ground rail 446 coupling the trench capacitors 460 to the active circuitry 440 through the redistribution layers 416 and the second micro-bumps 432. In this aspect of the present disclosure, the 3D stacked capacitor 450 is coupled to the first die 410 using a die-to-die (e.g., silicon-to-silicon) connection. According to some aspects of the present disclosure, the 3D stacked capacitor 450 is configured as a semiconductor die capacitor, a semiconductor trench capacitor, or other like die capacitor.

Figure 5:
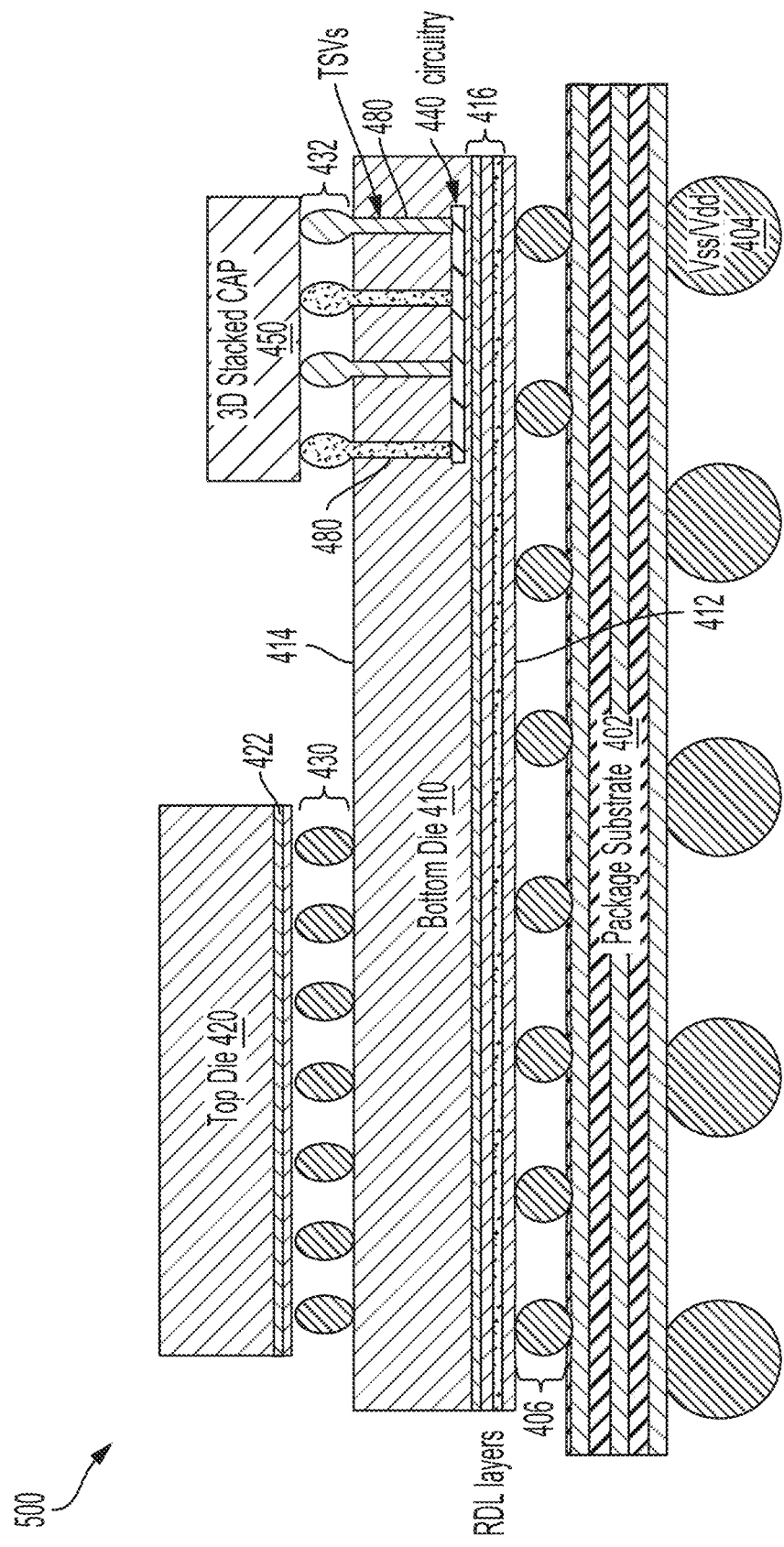
FIG. 5 is a cross-sectional diagram illustrating a three-dimensional (3D) integrated circuit (IC) stacked power distribution network (PDN) having a 3D stacked capacitor integrated on die, according to another aspect of the present disclosure.

FIG. 5 is a cross-sectional diagram illustrating a 3D integrated circuit (IC) 500, having the 3D stacked capacitor 450 on the first die 410 in a face-to-face (F2F) 3D IC PDN configuration, according to aspects of the present disclosure. In these aspects of the present disclosure, FIGS. 4A and 5 show different 3D IC PDN capacitor integration approaches for two different 3D IC PDN architectures. In FIGS. 4A and 5, the 3D stacked capacitor 450 provides capacitive decoupling for the active circuitry 440 in the first die 410. FIG. 5 shows a 3D IC 500 in a face-to-back (F2B) 3D IC PDN configuration, in which the first die 410 is flipped, with the 3D stacked capacitor 450 contacted to the second surface 414 of the first die 410 through the second micro-bumps 432.

In the F2B 3D IC PDN configuration of the 3D IC 500 shown in FIG. 5, through substrate vias (TSVs) 480 are formed in the first die 410 to contact the 3D stacked capacitor 450 to the active circuitry 440 through the second micro-bumps 432. By contrast, in the F2F 3D IC PDN configuration shown in FIG. 4A, the 3D stacked capacitor 450 is directly contacted to the active circuitry 440 without TSVs to provide decoupling to the active circuitry 440 under the 3D stacked capacitor 450. In these aspects of the present disclosure, the proposed capacitor integration approach may save landside capacitor space under a shadow of the first die 410 on the package substrate 402. In addition, the proposed capacitor integration approach may provide more effective capacitive decoupling relative to both a traditional landside capacitor (LSC) approach as well as a die side capacitor (DSC) approach.

Figure 6:
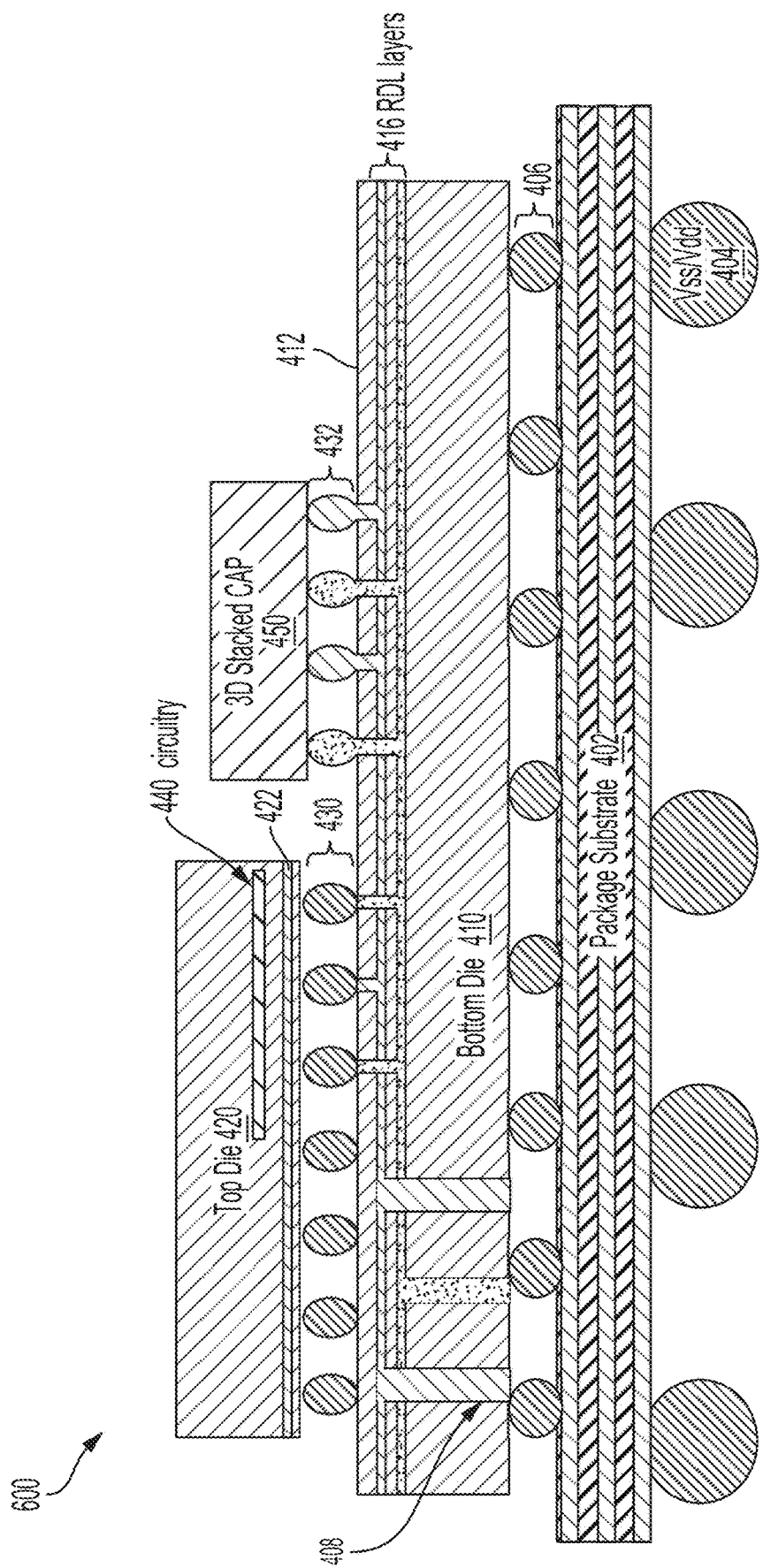
FIG. 6 is a cross-sectional diagram illustrating a three-dimensional (3D) integrated circuit (IC) stacked power distribution network (PDN) having a 3D stacked capacitor integrated on die, according to further aspects of the present disclosure.

FIG. 6 is a cross-sectional diagram illustrating a 3D IC 600 having the 3D stacked capacitor 450 on the first die 410 contacted to the active circuitry 440 in the second die 420, according to aspects of the present disclosure. The 3D IC 600 is similar to the 3D IC 400 shown in FIG. 4A and is shown using similar reference numbers. In this configuration, the 3D IC 600 also includes the first die 410 having the 3D stacked capacitor 450 on a first surface 412 of the first die 410. The 3D stacked capacitor 450 is also coupled to a power distribution network (e.g., the redistribution layers 416) of the first die 410, which may be referred to as a first PDN. The 3D IC 600 also includes the second die 420 stacked on the first surface 412 of the first die 410. The second die 420 is stacked on the first die 410 proximate to the 3D stacked capacitor 450 on the first surface 412 of the first die 410. In these aspects of the present disclosure, the active circuitry 440 is implemented within the second die 420 and contacted to the power rail 422 of the second die 420. The active circuitry 440 is coupled to the 3D stacked capacitor 450 through the redistribution layers 416, the second micro-bumps 432, the first micro-bumps 430, and the power rail 422 of the second die 420.

Figure 7:
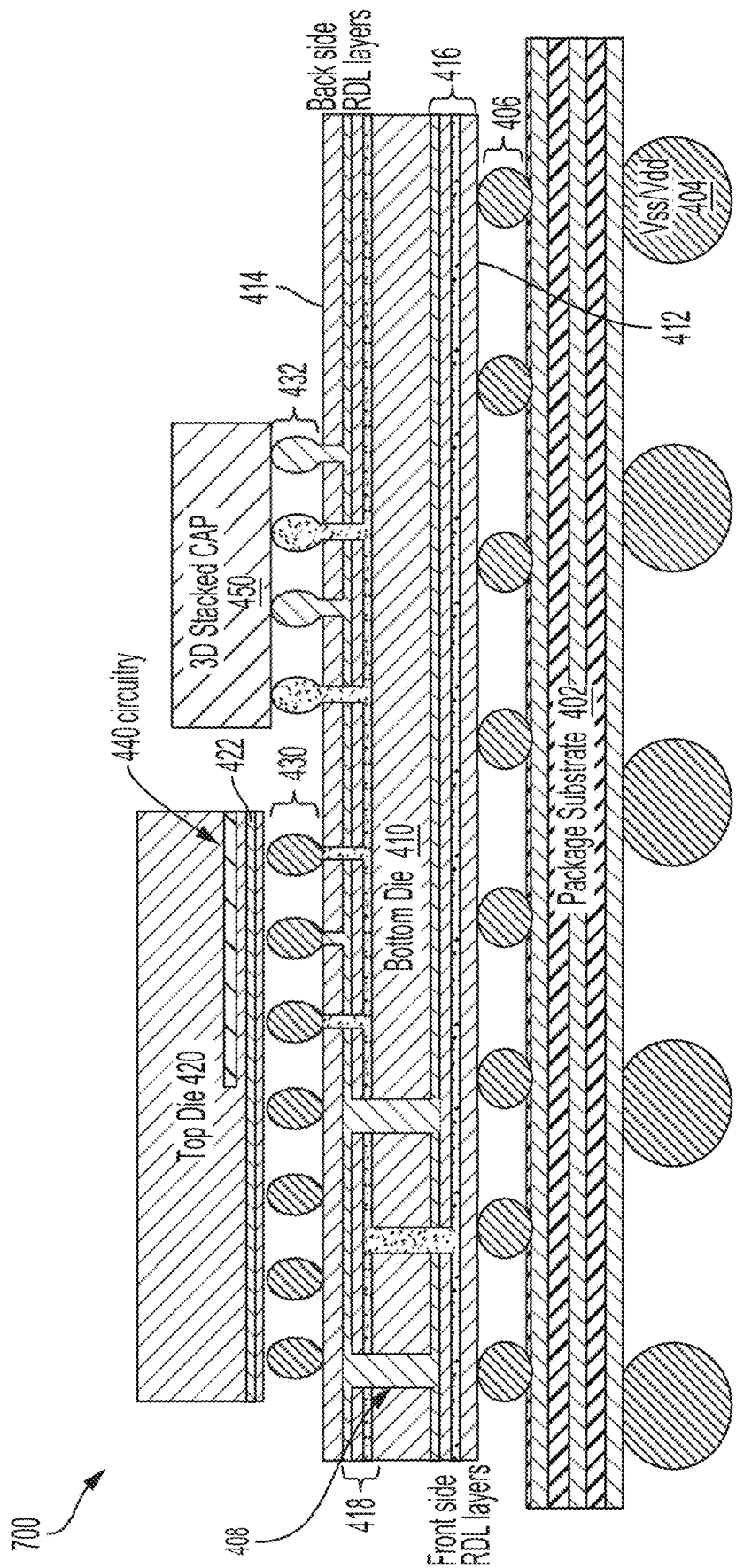
FIG. 7 is a cross-sectional diagram of a three-dimensional (3D) integrated circuit (IC) stacked power distribution network (PDN) having a 3D stacked capacitor integrated on die, according to another aspect of the present disclosure.

FIG. 7 is a cross-sectional diagram illustrating a 3D integrated circuit (IC) 700 having the 3D stacked capacitor 450 on a backside of the first die 410 and contacted to the active circuitry 440 in the second die 420, according to aspects of the present disclosure. The 3D IC 700 is similar to the 3D IC 600 shown in FIG. 6 and is shown using similar reference numbers. In this configuration, the first die 410 is flipped, such that backside redistribution layers (RDLs) 418 (e.g., a second PDN) are formed on the second surface 414 of the first die 410. In these aspects of the present disclosure, the 3D stacked capacitor 450 is on the second surface 414 of the first die 410 and coupled to the backside RDLs 418 through the second micro-bumps 432. In these aspects of the present disclosure, the active circuitry 440 is implemented within the second die 420 and contacted to the power rail 422 of the second die 420. The active circuitry 440 is coupled to the 3D stacked capacitor 450 through the backside RDLs 418, the second micro-bumps 432, the first micro-bumps 430, and the power rail 422 of the second die 420. In this configuration, the redistribution layers 416 may be coupled to the backside RDLs through the vias 408.

In these aspects of the present disclosure, the 3D IC PDN capacitor integration approach provides capacitive decoupling for the active circuitry 440 in the second die 420. In the F2F 3D IC PDN configuration shown in FIG. 6, the 3D stacked capacitor 450 contacts the active circuitry 440 using the redistribution layers 416 in the first surface 412 (e.g., front side) of the first die 410 to provide capacitive decoupling to the active circuitry 440. In the F2B 3D IC PDN configuration shown in FIG. 7, the 3D stacked capacitor 450 is contacted to the active circuitry 440 using the backside RDLs 418. These proposed capacitor integration approaches may save landside capacitor space under the shadow of the first die 410 on the package substrate 402. In addition, because the active circuitry 440 within the second die 420 may overlap with active circuitry (not shown) in the first die 410, in some cases a landside capacitor does not fit to provide decoupling for the active circuitry 440 within the second die 420. These aspects of the proposed approach offer a solution to provide decoupling for the active circuitry in the second die 420.

Aspects of the present disclosure are directed to a 3D IC stacked power distribution network having a 3D stacked capacitor integrated on die. Benefits of the present disclosure include more effective decoupling compared to landside capacitor placement on the package substrate due to a lower inductance connection. For example, the 3D stacked capacitor integration approach of the present disclosure may improve voltage droop by fifteen to thirty percent (15%-30%). In addition, aspects of the present disclosure provide additional capacitor placement options for situations in which limited space is available for placement of landside capacitors. Furthermore, aspects of the present disclosure support additional Vdd/Vss balls on the package substrate when a 3D stacked capacitor is used instead of landside capacitors. In particular, having additional Vdd/Vss balls improves the power distribution network as well as thermal performance of a 3D IC. A 3D stacked capacitor enables integration of a silicon trench capacitor, which has a much finer pitch relative to traditional landside capacitors. In addition, improved thermal performance is achieved by offsetting thermally challenging cores while not sacrificing the power distribution network.

Figure 8:
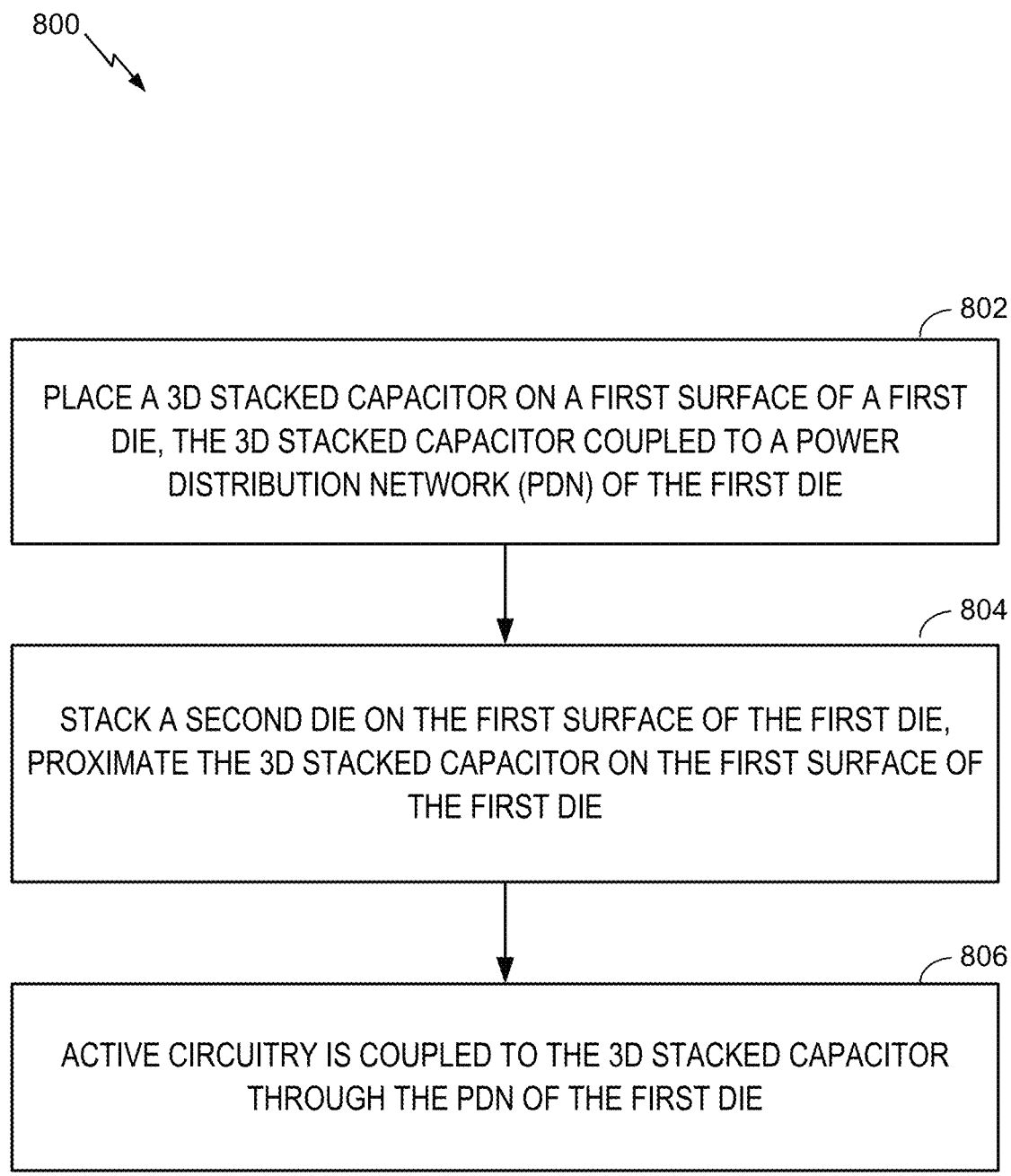
FIG. 8 is a process flow diagram illustrating a method for fabricating a three-dimensional (3D) power distribution network (PDN) capacitor integration, according to an aspect of the present disclosure.

FIG. 8 is a process flow diagram illustrating a method for fabricating a 3D power distribution network (PDN) capacitor integration, according to an aspect of the present disclosure. A method 800 begins in block 802, in which a 3D stacked capacitor is placed on a first surface of a first die, the 3D stacked capacitor coupled to a power distribution network (PDN) of the first die. For example, as shown in FIG. 4A, the 3D stacked capacitor 450 is placed proximate active circuitry 440 (e.g., logic circuitry). That is, the 3D stacked capacitor 450 is placed in close proximity to the active circuitry 440 (e.g., directly above the circuitry). In addition, the 3D stacked capacitor 450 is contacted to the active circuitry 440 using the second micro-bumps 432 and the redistribution layers 416 of a power distribution network (PDN). Placing the 3D stacked capacitor 450 on the first surface 412 of the first die 410 beneficially saves landside capacitor space under a die shadow on the package substrate 402.

At block 804, a second die is stacked on the first surface of the first die, proximate the 3D stacked capacitor on the first surface of the first die. For example, as shown in FIG. 4B, the 3D IC 470 includes the second die 420 stacked on the first surface 412 of the first die 410. The second die 420 is stacked on the first die 410 proximate to the 3D stacked capacitor 450 on the first surface 412 of the first die 410. At block 806, active circuitry is coupled to the 3D stacked capacitor through the PDN of the first die. For example, as shown in FIG. 4B, the 3D IC 470 includes the active circuitry 440 coupled to the 3D stacked capacitor 450 through the PDN of the first die 410 (e.g., using the second micro-bumps 432 and the redistribution layers 416).

According to a further aspect of the present disclosure, a 3D IC stacked power distribution network and a 3D stacked capacitor are integrated on die. The first die is stacked on the second die. The IC package further includes means for contacting an active circuitry to the 3D stacked capacitor. In one configuration, the contacting means may be the through substrate vias (TSV) 480, as shown in FIG. 5. In another aspect, the aforementioned means may be any structure or any material configured to perform the functions recited by the aforementioned means.

Figure 9:
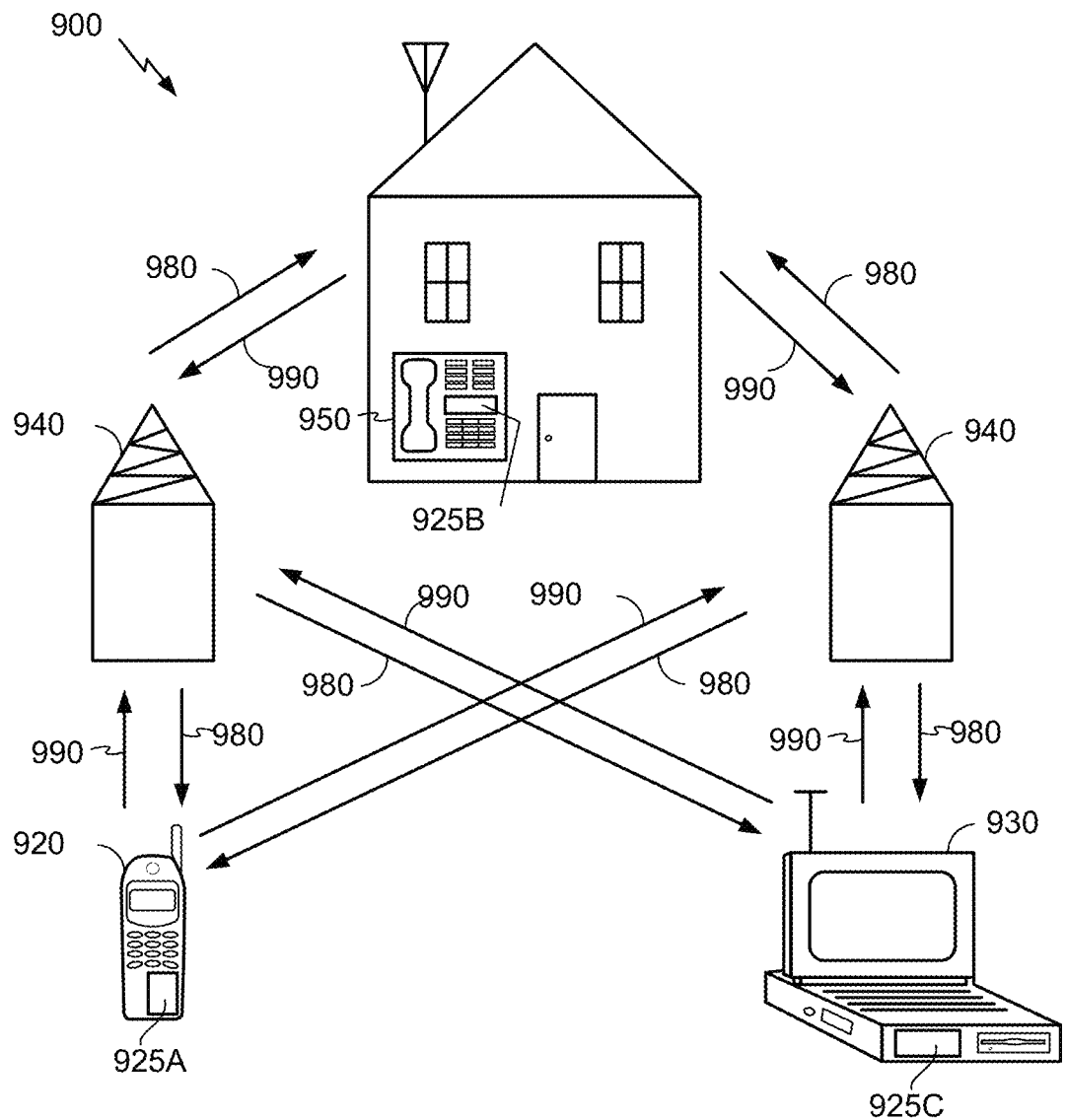
FIG. 9 is a block diagram showing an exemplary wireless communications system in which a configuration of the present disclosure may be advantageously employed.

FIG. 9 is a block diagram showing an exemplary wireless communications system 900, in which an aspect of the present disclosure may be advantageously employed. For purposes of illustration, FIG. 9 shows three remote units 920, 930, and 950, and two base stations 940. It will be recognized that wireless communications systems may have many more remote units and base stations. Remote units 920, 930, and 950 include integrated circuit (IC) devices 925A, 925B, and 925C that include the disclosed 3D stacked capacitor. It will be recognized that other devices may also include the disclosed 3D stacked capacitor, such as the base stations, switching devices, and network equipment. FIG. 9 shows forward link signals 980 from the base stations 940 to the remote units 920, 930, and 950, and reverse link signals 990 from the remote units 920, 930, and 950 to the base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 9 illustrates remote units according to the aspects of the present disclosure, the disclosure is not limited to these exemplary illustrated units. Aspects of the present disclosure may be suitably employed in many devices, which include the disclosed 3D stacked capacitor.

Figure 10:
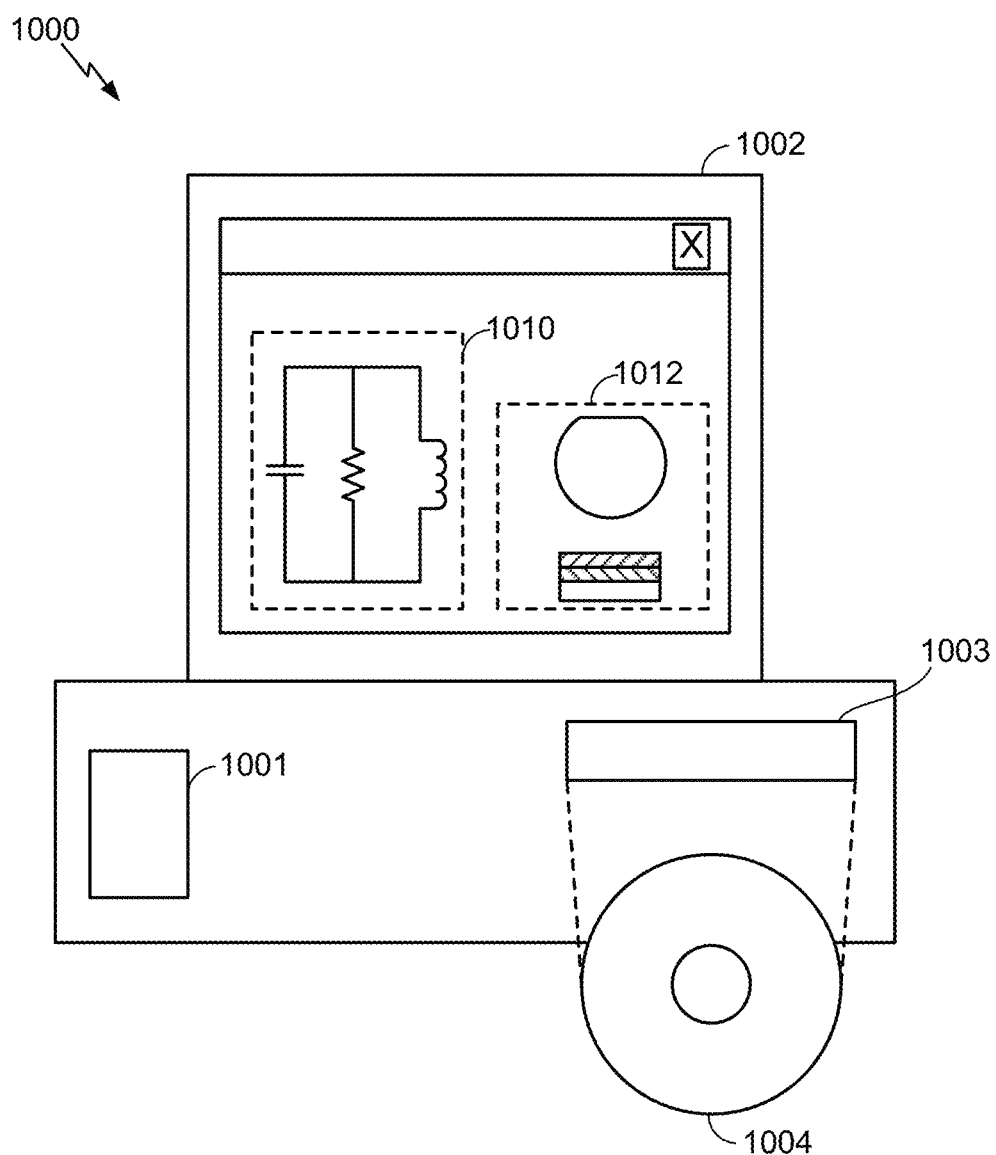
FIG. 10 is a block diagram illustrating a design workstation used for circuit, layout, and logic design of a semiconductor component according to one configuration.

FIG. 10 is a block diagram illustrating a design workstation 1000 used for circuit, layout, and logic design of a semiconductor component, such as the 3D stacked capacitor disclosed above. The design workstation 1000 includes a hard disk 1001 containing operating system software, support files, and design software such as Cadence or OrCAD. The design workstation 1000 also includes a display 1002 to facilitate design of a circuit 1010 or a semiconductor component 1012, such as the 3D stacked capacitor. A storage medium 1004 is provided for tangibly storing the design of the circuit 1010 or the semiconductor component 1012 (e.g., the 3D stacked capacitor). The design of the circuit 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the semiconductor component 1012 by decreasing the number of processes for designing semiconductor wafers.

Implementation examples are described in the following numbered clauses:

1. A three-dimensional (3D) integrated circuit (IC), comprising:
a first die having a 3D stacked capacitor on a first surface of the first die and coupled to a power distribution network (PDN) of the first die;
a second die stacked on the first surface of the first die, proximate the 3D stacked capacitor on the first surface of the first die; and
active circuitry coupled to the 3D stacked capacitor through the PDN of the first die.

2. The 3D IC of clause 1, further comprising a plurality of micro-bumps to connect the 3D stacked capacitor to the PDN of the first die.

3. The 3D IC of any of clauses 1-2, further comprising a plurality of micro-bumps to connect the second die to the PDN of the first die.

4. The 3D IC of any of clauses 1-3, in which the 3D stacked capacitor comprises a semiconductor die capacitor.

5. The 3D IC of claim 4, in which the semiconductor die capacitor comprises:
a silicon substrate; and
a plurality of trench capacitors in the silicon substrate.

6. The 3D IC of any of clauses 1-3, in which the 3D stacked capacitor comprises an integrated passive device (IPD) capacitor die.

7. The 3D IC of any of clauses 1-6, in which the active circuitry is integrated within the first die.

8. The 3D IC of any of clauses 1-7, in which the PDN is proximate the first surface of the first die and directly coupled between the active circuitry and the 3D stacked capacitor.

9. The 3D IC of any of clauses 1-7, in which the active circuitry is coupled to the PDN proximate a second surface, distal from the first surface, of the first die and coupled to the 3D stacked capacitor through a plurality of vias.

10. The 3D IC of any of clauses 1-9, in which the PDN comprises a first PDN proximate the first surface of the first die, and a second PDN proximate a second surface, distal from the first surface, of the first die.

11. The 3D IC of clause 10, further comprising a plurality of micro-bumps to connect the 3D stacked capacitor to the second PDN proximate the second surface of the first die.

12. The 3D IC of any of clauses 10-11, further comprising a plurality of micro-bumps to connect the second die to the second PDN proximate the second surface of the first die.

13. The 3D IC of any of clauses 1-12, further comprising a package substrate coupled to a second surface, distal from the first surface, of the first die through a plurality of package bumps.

14. A method for fabricating a three-dimensional (3D) integrated circuit (IC), comprising:
placing a 3D stacked capacitor on a first surface of a first die, the 3D stacked capacitor coupled to a power distribution network (PDN) of the first die;
stacking a second die on the first surface of the first die, proximate the 3D stacked capacitor on the first surface of the first die; and
coupling active circuitry to the 3D stacked capacitor through the PDN of the first die.

15. The method of clause 14, further comprising depositing a plurality of micro-bumps to connect the 3D stacked capacitor to the PDN of the first die.

16. The 3D IC of any of clauses 14-15, further comprising depositing a plurality of micro-bumps to connect the second die to the PDN of the first die.

17. The method of any of clauses 14-16, further comprises forming a plurality of trench capacitors in a silicon substrate to form the 3D stacked capacitor.

18. The method of any of clauses 14-17, further comprising integrating the active circuitry within the first die.

19. The method of any of clauses 14-18, further comprising:
forming the PDN proximate the first surface of the first die; and
directly coupling the PDN between the active circuitry and the 3D stacked capacitor.

20. The method of any of clauses 14-19, further comprising:
forming a first PDN proximate the first surface of the first die; and
forming a second PDN proximate a second surface, distal from the first surface, of the first die.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present disclosure is not intended to be limited to the particular configurations of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, erasable programmable read-only memory (EPROM), EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the present disclosure is provided to enable any person skilled in the art to make or use the present disclosure. Various modifications to the disclosure will be readily apparent to those skilled in the art, and the generic principles defined may be applied to other variations without departing from the spirit or scope of the disclosure. Thus, the present disclosure is not intended to be limited to the examples and designs described, but is to be accorded the widest scope consistent with the principles and novel features disclosed.

What is claimed is:

1. A three-dimensional (3D) integrated circuit (IC), comprising:
    a first die directly coupled to a 3D stacked capacitor on a first surface of the first die and coupled to a power distribution network (PDN) included in the first die;
    a second die stacked on the first surface of the first die, proximate the 3D stacked capacitor on the first surface of the first die; and
    active circuitry coupled to the 3D stacked capacitor through the PDN in the first die.

2. The 3D IC of claim 1, further comprising a plurality of micro-bumps to connect the 3D stacked capacitor to the PDN in the first die.

3. The 3D IC of claim 1, further comprising a plurality of micro-bumps to connect the second die to the PDN in the first die.

4. The 3D IC of claim 1, in which the 3D stacked capacitor comprises a semiconductor die capacitor.

5. The 3D IC of claim 4, in which the semiconductor die capacitor comprises:
    a silicon substrate; and
    a plurality of trench capacitors in the silicon substrate.

6. The 3D IC of claim 1, in which the 3D stacked capacitor comprises an integrated passive device (IPD) capacitor die.

7. The 3D IC of claim 1, in which the active circuitry is integrated within the first die.

8. The 3D IC of claim 1, in which the PDN is proximate the first surface of the first die and directly coupled between the active circuitry and the 3D stacked capacitor.

9. The 3D IC of claim 1, in which the active circuitry is coupled to the PDN proximate a second surface, distal from the first surface, of the first die and coupled to the 3D stacked capacitor through a plurality of vias.

10. The 3D IC of claim 1, in which the PDN comprises a first PDN proximate the first surface of the first die, and a second PDN proximate a second surface, distal from the first surface, of the first die.

11. The 3D IC of claim 10, further comprising a plurality of micro-bumps to connect the 3D stacked capacitor to the second PDN proximate the second surface of the first die.

12. The 3D IC of claim 10, further comprising a plurality of micro-bumps to connect the second die to the second PDN proximate the second surface of the first die.

13. The 3D IC of claim 1, further comprising a package substrate coupled to a second surface, distal from the first surface, of the first die through a plurality of package bumps.

14. A method for fabricating a three-dimensional (3D) integrated circuit (IC), comprising:
    placing a 3D stacked capacitor directly on a first surface of a first die, the 3D stacked capacitor coupled to a power distribution network (PDN) included in the first die;
    stacking a second die on the first surface of the first die, proximate the 3D stacked capacitor on the first surface of the first die; and
    coupling active circuitry to the 3D stacked capacitor through the PDN in the first die.

15. The method of claim 14, further comprising depositing a plurality of micro-bumps to connect the 3D stacked capacitor to the PDN in the first die.

16. The 3D IC of claim 14, further comprising depositing a plurality of micro-bumps to connect the second die to the PDN in the first die.

17. The method of claim 14, further comprises forming a plurality of trench capacitors in a silicon substrate to form the 3D stacked capacitor.

18. The method of claim 14, further comprising integrating the active circuitry within the first die.

19. The method of claim 14, further comprising:
    forming the PDN proximate the first surface of the first die; and
    directly coupling the PDN between the active circuitry and the 3D stacked capacitor.

20. The method of claim 14, further comprising:
    forming a first PDN proximate the first surface of the first die; and
    forming a second PDN proximate a second surface, distal from the first surface, of the first die.

* * * * *